(12) United States Patent
Iwakura

(10) Patent No.: US 11,692,683 B2
(45) Date of Patent: *Jul. 4, 2023

(54) LIGHTING APPARATUS

(71) Applicant: NICHIA CORPORATION, Anan (JP)

(72) Inventor: Daisuke Iwakura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/369,521

(22) Filed: Jul. 7, 2021

(65) Prior Publication Data

US 2021/0332965 A1 Oct. 28, 2021

Related U.S. Application Data

(62) Division of application No. 16/260,957, filed on Jan. 29, 2019, now Pat. No. 11,085,605.

(30) Foreign Application Priority Data

Jan. 30, 2018 (JP) ................. 2018-013643

(51) Int. Cl.
*F21V 9/32* (2018.01)
*F21S 43/20* (2018.01)
(Continued)

(52) U.S. Cl.
CPC .............. *F21S 43/255* (2018.01); *B60Q 1/34* (2013.01); *B60Q 1/44* (2013.01); *C09K 11/641* (2013.01);
(Continued)

(58) Field of Classification Search
CPC ........ B60Q 1/34; B60Q 1/44; B60Q 2400/20; C09K 11/641; C09K 11/7706;
(Continued)

(56) References Cited

U.S. PATENT DOCUMENTS

| 7,471,040 B2 | 12/2008 | Nishimura | |
| 7,963,665 B2* | 6/2011 | Minoda | F21S 41/153 362/249.02 |

(Continued)

FOREIGN PATENT DOCUMENTS

| DE | 102006040393 A1 | 3/2008 |
| DE | 102014211833 A1 | 12/2015 |

(Continued)

*Primary Examiner* — Zheng Song
(74) *Attorney, Agent, or Firm* — Birch, Stewart, Kolasch & Birch, LLP

(57) ABSTRACT

A lighting apparatus includes light emitting elements having an emission peak wavelength of 400 to 510 nm, a first phosphor having an emission peak wavelength of 485 to 700 nm, a second phosphor having an emission peak wavelength of 510 to 590 nm, a third phosphor having an emission peak wavelength of 600 to 700 nm, and a color filter having transmittance for light with a wavelength of 600 to 730 nm that is 80% or more and transmittance for light with a wavelength of 410 to 480 nm that is 3% or more and 50% or less. The color filter transmits a part of light emitted from the first phosphor, at least a part of light emitted from the second phosphor, and at least a part of light emitted from the third phosphor. Light transmitted through the color filter is emitted to the outside.

16 Claims, 7 Drawing Sheets

(51) Int. Cl.

| | | |
|---|---|---|
| *F21V 9/08* | (2018.01) | |
| *F21S 43/16* | (2018.01) | |
| *H01L 25/075* | (2006.01) | |
| *C09K 11/64* | (2006.01) | |
| *H01L 33/50* | (2010.01) | |
| *H01L 33/60* | (2010.01) | |
| *C09K 11/77* | (2006.01) | |
| *H01L 33/48* | (2010.01) | |
| *F21V 9/40* | (2018.01) | |
| *B60Q 1/44* | (2006.01) | |
| *B60Q 1/34* | (2006.01) | |
| *F21W 103/35* | (2018.01) | |
| *F21W 103/20* | (2018.01) | |

(52) U.S. Cl.
CPC .......... *C09K 11/7706* (2013.01); *F21S 43/16* (2018.01); *F21V 9/08* (2013.01); *F21V 9/32* (2018.02); *F21V 9/40* (2018.02); *H01L 25/0753* (2013.01); *H01L 33/486* (2013.01); *H01L 33/502* (2013.01); *H01L 33/507* (2013.01); *H01L 33/60* (2013.01); *B60Q 2400/20* (2013.01); *F21W 2103/20* (2018.01); *F21W 2103/35* (2018.01)

(58) Field of Classification Search
CPC ........ F21S 41/176; F21S 43/16; F21S 43/255; F21V 9/08; F21V 9/32; F21V 9/40; F21W 2103/20; F21W 2103/35; H01L 25/0753; H01L 33/486; H01L 33/502; H01L 33/507; H01L 33/60
See application file for complete search history.

(56) References Cited

U.S. PATENT DOCUMENTS

| | | | |
|---|---|---|---|
| 2004/0218400 A1* | 11/2004 | Egashira | B60Q 1/2607 362/520 |
| 2005/0117361 A1 | 6/2005 | Takeda et al. | |
| 2009/0010013 A1 | 1/2009 | Hessling | |
| 2009/0225564 A1 | 9/2009 | Minoda et al. | |
| 2009/0296384 A1* | 12/2009 | Van De Ven | F21K 9/232 362/231 |
| 2011/0133654 A1 | 6/2011 | McKenzie et al. | |
| 2012/0087108 A1 | 4/2012 | Ke et al. | |
| 2014/0055982 A1 | 2/2014 | Tao et al. | |
| 2015/0085467 A1* | 3/2015 | Tsumori | F21S 43/255 362/84 |
| 2016/0003440 A1 | 1/2016 | Wataya et al. | |
| 2016/0010826 A1 | 1/2016 | Tsukatani et al. | |
| 2016/0011354 A1* | 1/2016 | Achi | G02B 6/0068 362/613 |
| 2016/0155775 A1* | 6/2016 | Yano | H01L 25/0753 257/89 |
| 2017/0144586 A1 | 5/2017 | Tokida | |
| 2017/0241614 A1* | 8/2017 | Vincens | F21S 43/19 |
| 2019/0017664 A1 | 1/2019 | Lee et al. | |

FOREIGN PATENT DOCUMENTS

| | | |
|---|---|---|
| JP | 01-130205 U | 9/1989 |
| JP | 2000-149615 A | 5/2000 |
| JP | 2002-133915 A | 5/2002 |
| JP | 2004-241348 A | 8/2004 |
| JP | 2005-123165 A | 5/2005 |
| JP | 2009-117115 A | 5/2009 |
| JP | 2011-154895 A | 8/2011 |
| JP | 2014-143344 A | 8/2014 |
| JP | 2014-197527 A | 10/2014 |
| JP | 2015-2182 A | 1/2015 |
| JP | 2015-088220 A | 5/2015 |
| JP | 2015-088483 A | 5/2015 |
| JP | 2016-146356 A | 8/2016 |
| WO | WO 2015/193039 A1 | 12/2015 |

* cited by examiner

LIGHTING APPARATUS

CROSS-REFERENCE TO RELATED APPLICATIONS

This application is a Divisional of U.S. application Ser. No. 16/260,957 filed on Jan. 29, 2019, which claims the priority benefit under 35 U.S.C. 119(a) to Japanese Patent Application No. 2018-013643, filed on Jan. 30, 2018, all of which are hereby expressly incorporated by reference into the present application.

BACKGROUND OF THE INVENTION

Technical Field

The present disclosure relates to a lighting apparatus.

Description of Related Art

An automobile is required to be provided with brake lamps (stop lamps), turn signal lamps (winkers), tail lamps, back lamps, and reflex reflectors on the rear surface of a vehicle body. Further, standards of colors, brightness, and the like of lamp light and reflected light are specified. These various lamps are collected as one unit and attached to the vehicle body as a pair of left and right rear combination lamps. As a general rear combination lamp, a lighting apparatus that emits, for respective divided regions, beams of light of two or three colors of red used for both of the brake lamps and the tail lamps and at least one of orange of the turn signal lamps and white of the back lamps is used. The rear combination lamp is sometimes originally designed as an ornament of the automobile according to a color scheme by light colors and a shape.

Such a lighting apparatus for an automobile includes as light sources light emitting devices including a light emitting diode (LED) and the like. In the lighting apparatus, the light emitting devices are housed in a base member (a housing) having a reflection film on its inner surface and an opening of the base member is closed with a plate cover (outer lens) formed of transparent resin or the like, as to be an emitting surface. In order to include the rear reflex reflectors that reflecting red light, the lighting apparatus includes, as a cover for a region of a red lamp, a red cover made of transparent resin or the like colored in red by pigment and a transparent (clear) cover combined with a light emitting device, which emits white light, to form a region of a white lamp. Alternatively, the lighting apparatus further includes an orange cover in a region of an orange lamp. Therefore, plate members of two colors of transparent and red or three colors of the two colors and orange are applied to the covers of the lighting apparatus. The covers are individually attached to the base member or a one color-coded plate member obtained by integrally molding a resin material is applied.

However, if a cover covering a surface is configured by two or more kinds of plate members, the shapes of components configuring the cover are complicated and the number of components increases. In order to form such a cover with integral molding, a die has a complicated shape. Further, the formation is complicated. Therefore, a lighting apparatus that can emit not only red light but also orange light and white light, with an entire emission surface thereof covered with only a red cover has been developed (see Japanese Patent Application Publication Nos. 2009-117115 and 2004-241348).

SUMMARY

A lighting apparatus according to an aspect of the present disclosure includes: a first light emitting element having an emission peak wavelength of 400 nm or more and 510 nm or less; a first phosphor disposed in such a position that light emitted by the first light emitting element is incident on the first phosphor, the first phosphor is excited by the light, and the first phosphor has an emission peak wavelength of 485 nm or more and 700 nm or less; and a color filter having transmittance for light with a wavelength of 600 nm or more and 730 nm or less that is 80% or more and transmittance for light with a wavelength of 410 nm or more and 480 nm or less that is 3% or more and 50% or less, being disposed in such a position that first light emitted from the first phosphor is incident on the color filter, and transmitting a part of the first light. The lighting apparatus emits light transmitted through the color filter.

With the embodiment according to the present disclosure, a specified light color other than red can be obtained even if a cover made of a red color filter is provided over an entire emission surface. A degree of freedom of design is high and cost is reduced.

BRIEF DESCRIPTION OF THE DRAWINGS

A more complete appreciation of embodiments of the invention and many of the attendant advantages thereof will be readily obtained as the same becomes better understood by reference to the following detailed description when considered in connection with the accompanying drawings.

DETAILED DESCRIPTION OF THE EMBODIMENTS

Figure 1:
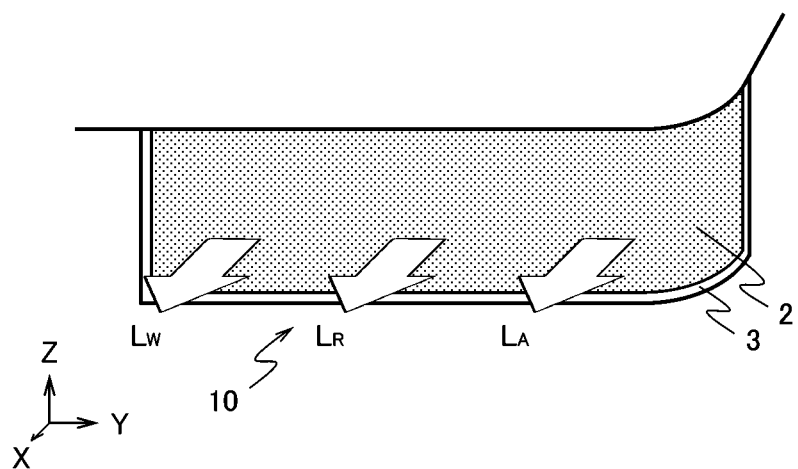
FIG. 1 is an exterior view schematically showing a state in which a lighting apparatus according to an embodiment is attached to a vehicle body.

The embodiments will now be described with reference to the accompanying drawings, wherein like reference numerals designate corresponding or identical elements throughout the various drawings.

A lighting apparatus according to an embodiment of the present disclosure is explained below. The lighting apparatus according to this embodiment is applied to a rear combination lamp attached near both ends in a vehicle width direction on a rear surface of a vehicle body of an automobile. The lighting apparatus emits light in the rear direction of the automobile. The drawings referred to in the following explanation schematically show the embodiment of the present disclosure. Therefore, sizes, positional relations, and the like of members shown in the drawings are sometimes exaggerated or shapes of the members are sometimes simplified. In the following explanation, the same names and signs indicate the same or equivalent members in principle. Detailed explanation of the members is omitted as appropriate.

[Lighting Apparatus]

Figure 2:
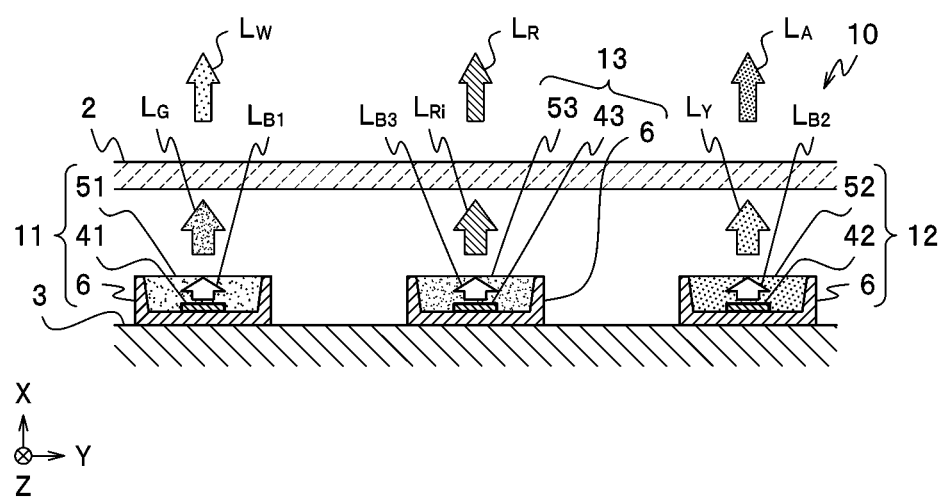
FIG. 2 is an enlarged sectional view schematically showing a partial configuration of the lighting apparatus according to the embodiment.

The configuration of the lighting apparatus according to the embodiment of the present disclosure is explained with reference to FIGS. 1 and 2. FIG. 1 is an exterior view schematically showing a state in which the lighting apparatus according to the embodiment is attached to a vehicle body. FIG. 2 is an enlarged sectional view schematically showing a partial configuration of the lighting apparatus according to the embodiment. Note that, in this embodiment, unless specifically described otherwise, the top and the bottom in the sectional view of FIG. 2 are explained as the top and the bottom.

A lighting apparatus 10 includes: a first light emitting element 41 having an emission peak wavelength of 400 nm or more and 510 nm or less; a first phosphor disposed in such a position that light $L_{B1}$ emitted by the first light emitting element 41 is incident on the first phosphor, the first phosphor is excited by the light $L_{B1}$, and the first phosphor has an emission peak wavelength of 485 nm or more and 700 nm or less; and a color filter 2 having transmittance for light with a wavelength of 600 nm or more and 730 nm or less that is 80% or more and transmittance for light with a wavelength of 410 nm or more and 480 nm or less that is 3% or more and 50% or less, being disposed in such a position that first light $L_G$ emitted from the first phosphor is incident on the color filter 2, and transmitting a part of the first light $L_G$. The lighting apparatus 10 emits light $L_W$ transmitted through the color filter 2. The lighting apparatus 10 includes a first phosphor layer 51 explained below. A granular first phosphor is contained in the first phosphor layer 51. The lighting apparatus 10 further includes a second light emitting element 42 and a third light emitting element 43 having an emission peak wavelength of 400 nm or more and 510 nm or less, a second phosphor layer 52 containing a granular second phosphor, and a third phosphor layer 53 containing a granular third phosphor. Such a lighting apparatus 10 includes a first light emitting device 11 including the first light emitting element 41 and the first phosphor layer 51 in a recessed section of a package 6, a second light emitting device 12 including the second light emitting element 42 and the second phosphor layer 52 in a recessed section of a package 6, and a third light emitting device 13 including the third light emitting element 43 and the third phosphor layer 53 in a recessed section of a package 6. The lighting apparatus 10 includes a housing 3, which is an opened housing that houses the first light emitting device 11, the second light emitting device 12, and the third light emitting device 13, and a color filter 2 that closes an opening of the housing 3. In FIG. 2, to simplify explanation, the lighting apparatus 10 is shown as including one each of the first light emitting device 11, the second light emitting device 12, and the third light emitting device 13.

A pair of two lighting apparatuses 10 is used in the rear of a vehicle body. The pair of two lighting apparatuses 10 is symmetric with respect to the center in the width direction of the vehicle body. The lighting apparatus 10 has a rectangular parallelepiped outline long in a vehicle width direction (a Y direction) of an automobile to which the lighting apparatus 10 is attached. The lighting apparatus 10 is embedded in attached to the vehicle body such that an emission surface is exposed to the rear surface of the vehicle body. The emission surface of the lighting apparatus 10 is divided into three regions in the Y direction. The regions emit white light $L_W$, red light $L_R$, and orange light $L_A$ in order from the center in the vehicle width direction toward the side surface of the vehicle body. The lighting apparatus 10 reflects, with light from the outside, red light from the color filter 2 that covers the entire emission surface. In this embodiment, orange includes amber.

The white light $L_W$ is light of back lamps of the automobile, the orange light $L_A$ is light of turn signal lamps of the automobile, and the red light $L_R$ is light of brake lamps and tail lamps of the automobile. Light colors are specified in JIS D5500. The white light $L_W$ is specified in a chromaticity range of 0.500≥x≥0.310, y≤0.150+0.640x, y≥0.050+0.750x, and 0.440?y≥0.382 in chromaticity coordinates of JIS Z8701. The orange light $L_A$ is specified in a chromaticity range of 0.429≥y≥0.398 and z≤0.007 in the chromaticity coordinates of JIS Z8701. The red light $L_R$ is specified in a chromaticity range of y≤0.335 and z≤0.008 in the chromaticity coordinates of JIS Z8701. A light color of light reflected on the emission surface of the lighting apparatus 10 is desirable specified in the same chromaticity range as the red light $L_R$. In order to set such light colors of the lights and the reflected light, the members of the lighting apparatus 10 are configured as explained below.

(First Light Emitting Element, Second Light Emitting Element, and Third Light Emitting Element)

The first light emitting element 41, the second light emitting element 42, and the third light emitting element 43 are semiconductor light emitting elements that emit beams of light $L_{B1}$, $L_{B2}$, and $L_{B3}$ having an emission peak wavelength of 400 nm or more and 510 nm or less. The first light emitting element 41, the second light emitting element 42, and the third light emitting element 43 may have different emission peak wavelengths if the emission peak wavelength is within the range. Semiconductor light emitting elements of the same type or semiconductor light emitting elements of different types can be applied. In particular, the emission peak wavelength of the first light emitting element 41 is desirably 480 nm or less, and desirably 420 nm or more.

Examples of such light emitting elements include an InGaN-based nitride semiconductor such as $In_xAl_YGa_{1-X-Y}N$ (0≤X≤1, 0≤Y≤1, X+Y<1). In this embodiment, the first light emitting element 41, the second light emitting element 42, and the third light emitting element 43 have the same structure. If not specified, the first light emitting element 41, the second light emitting element 42, and the third light emitting element 43 are referred to as light emitting element 4. Beams of blue light $L_{B1}$, $L_{B2}$, and $L_{B3}$ are referred to as blue light $L_B$. The light emitting element 4 is mounted on the package 6 and connected to lead electrodes provided to be exposed to the bottom surface of the recessed section of the package 6. The light emitting element 4 may have any shape, any size, any mounting form (flip-chip or wire bonding), and the like as long as it emits the light with the wavelength, having a light amount necessary per one light emitting element.

(First Phosphor Layer)

The first phosphor layer 51 is disposed in such a position that the light $L_{B1}$ emitted by the first light emitting element 41 is incident on the first phosphor layer 51. The first phosphor layer 51 is excited by at least partial light of the blue light $L_{B1}$ and emits light wavelength-converted into a specific wavelength longer than the wavelength of the blue light $L_{B1}$. The first phosphor layer 51 is disposed to change the blue light $L_{B1}$ to the white light $L_W$ when it passes through the color filter 2. Therefore, an emission peak wavelength of the first phosphor layer 51 is 485 nm or more and 700 nm or less, desirably 500 nm or more, and desirably 580 nm or less. Examples of such a phosphor include: a silicate-based oxide phosphor including a chloro-silicate-based phosphor such as $Ca_8MgSi_4O_{16}Cl_2$:Eu; an aluminate-based phosphor such as $Sr_4Al_{14}O_{25}$:Eu; oxynitride phosphors such as $(Si, Al)_6(O, N)_8$:Eu, $BaSi_2O_2N_2$:Eu, and $Ca_X(Si, Al)_{12}(O, N)_{16}$:Eu; oxide phosphors such as yttrium aluminum garnet phosphor (YAG phosphor), lutetium aluminum garnet phosphor, terbium aluminum garnet phosphor, and garnet phosphors obtained by replacing a part of these compositions; and nitride phosphors such as $CaAlSiN_3$:Eu (CASN phosphor), $(Ca, Sr)AlSiN_3$:Eu, $(Ca, Sr)_2Si_5N_8$:Eu, $(Ba, Sr)_2Si_5N_8$:Eu, and $SrLiAl_3N_4$:Eu.

In the first light emitting device 11, the first phosphor layer 51 is disposed as a sealing member of the first light emitting element 41. Therefore, the first phosphor layer 51 contains transparent resin such as epoxy resin or silicone resin in which the first phosphor is dispersed, and is filled in the recessed section of the package 6. The first phosphor layer 51 wavelength-converts at least apart of the light $L_{B1}$ emitted by the first light emitting element 41. In detail, as explained below, a phosphor layer having a desired emission wavelength is selected as the first phosphor layer 51. A wavelength conversion rate of the light $L_{B1}$ emitted by the first light emitting element 41 is set. The wavelength conversion rate can be adjusted by the content of a phosphor in transparent resin, the thickness on the first light emitting element 41, and the like of the first phosphor layer 51.

(Second Phosphor Layer)

The second phosphor layer 52 is disposed in such a position that the light $L_{B2}$ emitted by the second light emitting element 42 is incident on the second phosphor layer 52. The second phosphor layer 52 is excited by at least a partial light of the blue light $L_{B2}$ and emits light wavelength-converted into a specific wavelength longer than the wavelength of the blue light $L_{B2}$. The second phosphor layer 52 is disposed to change the blue light $L_{B2}$ to the orange light $L_A$ when it passes through the color filter 2. Therefore, an emission peak wavelength of the second phosphor layer 52 is 510 nm or more and 590 nm or less, desirably 530 nm or more, more desirably 550 nm or more, and desirably 580 nm or less. Examples of such a phosphor include: oxide phosphors such as yttrium aluminum garnet phosphor (YAG phosphor), lutetium aluminum garnet phosphor, terbium aluminum garnet phosphor, and garnet phosphor obtained by replacing a part of these compositions; a silicate-based oxide phosphor including a chloro-silicate-based phosphor such as $Ca_8MgSi_4O_{16}Cl_2$:Eu; and an oxynitride phosphor such as $(Si, Al)_6(O, N)_8$:Eu. As in the first phosphor layer 51, in the second light emitting device 12, the second phosphor layer 52 is disposed as a sealing member of the second light emitting element 42. Therefore, the second phosphor layer 52 contains transparent resin in which the second phosphor is dispersed, and is filled in the recessed section of the package 6. The second phosphor layer 52 wavelength-converts at least a part of the light $L_{B2}$ emitted by the second light emitting element 42 and desirably wavelength-converts a larger amount of the light $L_{B2}$.

(Third Phosphor Layer)

The third phosphor layer 53 is disposed in such a position that the light $L_{B3}$ emitted by the third light emitting element 43 is incident on the third phosphor layer 53. The third phosphor layer 53 is excited by at least a partial light of the blue light $L_{B3}$ and emits light wavelength-converted into a specific wavelength longer than the wavelength of the blue light $L_{B3}$. The third phosphor layer 53 is disposed to change the blue light $L_{B3}$ to the red light $L_R$ when it passes through the color filter 2. Therefore, an emission peak wavelength of the third phosphor layer 53 is 600 nm or more and 700 nm or less, desirably 610 nm or more, and more desirably 630 nm or more. Examples of such a phosphor include nitride phosphors such as $CaAlSiN_3$:Eu (CASN phosphor), $(Ca, Sr)AlSiN_3$:Eu, $(Ca, Sr)_2Si_5N_8$:Eu, $SrLiAl_3N_4$:Eu, and $(Ba, Sr)_2Si_5N_8$:Eu and an oxynitride phosphor such as $Ca_X(Si, Al)_{12}(O, N)_{16}$:Eu. As in the first phosphor layer 51, in the third light emitting device 13, the third phosphor layer 53 is disposed as a sealing member of the third light emitting element 43. Therefore, the third phosphor layer 53 contains transparent resin in which the third phosphor is dispersed, and is filled in the recessed section of the package 6. The third phosphor layer 53 wavelength-converts at least a part of the light $L_{B3}$ emitted by the third light emitting element 43 and desirably wavelength-converts a larger amount of the light $L_{B3}$.

(Color Filter)

The color filter 2 is disposed in such a position that the first light $L_G$ emitted from the first phosphor layer 51, the second light $L_Y$ emitted from the second phosphor layer 52, and the third light $L_{Ri}$ emitted from the third phosphor layer 53 is incident on the color filter 2. The color filter 2 is a cover in the lighting apparatus 10, that is, a so-called outer lens of a lamp for an automobile. The color filter 2 is disposed to impart a function of a reflector of an automobile to at least a part of the emission surface of the lighting apparatus 10. The color filter 2 functions as a reflector. Light is incident on the color filter 2 from the outside. In order to reflect red light in the chromaticity range explained above, the color filter 2 absorbs a large amount of light other than the red light relatively and transmits the remainder of the light.

Further, the color filter 2 has restrictive transmissions for the light other than the red light, in order for the lighting apparatus 10 to emit the white light $L_W$. Specifically, the color filter 2 has transmittance for light with a wavelength of 600 nm or more and 730 nm or less that is 80% or more. The color filter 2 has transmittance for light with a wavelength of 410 nm or more and 480 nm or less that is 3% or more and 50% or less and desirably 5% or more. The color filter 2 has more desirably maximum transmittance for light with a wavelength of 410 nm or more and 480 nm or less that is 20% or more. If the transmittance for the light with the wavelength range is high, emission efficiency of the white light $L_W$ increases. The color filter 2 has desirably transmittance for light with a wavelength of 500 nm or more and 550 nm or less that is 20% or less. With such characteristics of the color filter 2, in the lighting apparatus 10, three beams of light transmitted through one color filter 2 are emitted as light $L_W$, $L_A$, and $L_R$ of different colors.

The color filter 2 is formed of transparent resin having necessary strength such as acrylic resin or polycarbonate resin colored by red pigment such as an azo compound, a cyanine compound, a perylene compound, or a dioxazine compound. With such a component, at least a part of the color filter 2 or desirably the entire color filter 2 is specified in a chromaticity range of y≤0.335 and z≤0.008 in the chromaticity coordinates of JIS Z8701. The color filter 2 is called outer lens. However, the color filter 2 may have a lens function or may be transparent. In the color filter 2, unevenness (a lens cut or a microprism) is desirably formed on the rear surface (the inner surface) or the surface such that at least a part of a region of the color filter 2 is formed as a recursive reflector.

(Package)

The package 6 configures respective exteriors of the first light emitting device 11, the second light emitting device 12, and the third light emitting device 13. The package 6 is a base that supports the light emitting element 4 and is a resin molded body that houses the first phosphor layer 51, the second phosphor layer 52, and the third phosphor layer 53. The package 6 is a light reflecting member for efficiently emitting light upward (to the emission surface side) and emitting the light to spread at a desired angle centering on the upward direction. The external shape of the package 6 is a thin substantially rectangular parallelepiped. A recessed section opening to spread upward is formed. The package 6 formed by adding a light reflective substance such as titanium oxide ($TiO_2$) to resin such as silicone resin, modified silicone resin, epoxy resin, modified epoxy resin, acrylic resin, or hybrid resin including at least one or more kinds of these kinds of resin. The package 6 includes a pair of lead electrodes connected to the light emitting element 4 to supply an electric current from the outside.

(Housing)

The housing 3 is a housing opened on the emission surface, configures the exterior of the lighting apparatus 10. The housing 3 houses the first light emitting device 11, the second light emitting device 12, and the third light emitting device 13, and supports the color filter 2 to close the opening. The housing 3 is desirably a light reflector having the inner surface of which is a reflection surface. With such a housing 3, it is possible to efficiently emit the beams of emission light $L_G$, $L_Y$, and $L_{Ri}$ from the first light emitting device 11, the second light emitting device 12, and the third light emitting device 13 toward the color filter 2 and further emit the beams of light $L_W$, $L_A$, and $L_R$ from the lighting apparatus 10 to spread at a desired angle centering on the upward direction (the rear direction in the automobile). The housing 3 has desirably a structure capable of detaching and attaching so that the first light emitting device 11, the second light emitting device 12, and the third light emitting device 13 to be individually replaceable.

[Operation of Lighting Apparatus]

Figure 3:
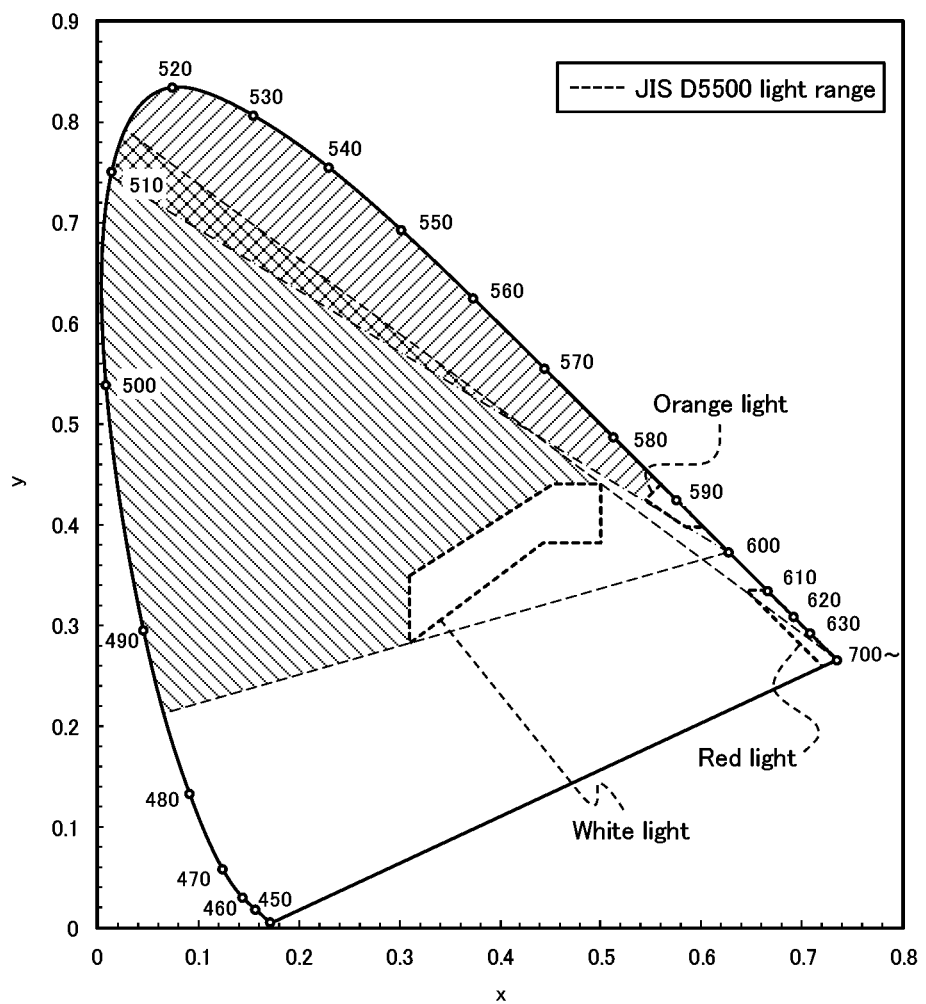
FIG. 3 is a chromaticity diagram for explaining transition of chromaticity of light by a color filter in the lighting apparatus according to the embodiment.

The operation of the lighting apparatus according to this embodiment is explained with reference to FIGS. 2 and 3. FIG. 3 is a chromaticity diagram for explaining transition of chromaticity of light by the color filter in the lighting apparatus according to this embodiment.

Operation for emitting the white light $L_W$ is explained. When passing through the first phosphor layer 51, at least a part of the blue light $L_{B1}$ emitted by the first light emitting element 41 is wavelength-converted by the first phosphor in the first phosphor layer 51. The wavelength-converted light or light obtained by mixing the light and the light $L_{B1}$ passed through the transparent resin in the first phosphor layer 51 without being wavelength-converted is emitted from the first light emitting device 11 as the first light $L_G$. When passing through the color filter 2, a part of light with a wavelength of 410 to 480 nm and at least a part of light with a wavelength of 500 to 550 nm contained in the first light $L_G$ are absorbed by the color filter 2. Thereby the first light $L_G$ is shifted to the white light $L_W$, and the white light $L_W$ is emitted from the lighting apparatus 10. In detail, since the color filter 2 mainly absorbs 80% or more of green light with a wavelength of 500 to 550 nm, the white light $L_W$ is mixed light of mainly light of blue purple to blue to greenish blue and light of yellow to yellowish orange.

When light in a chromaticity range that shown a downward to right hatched area in FIG. 3 is transmitted through a red color filter transmitting a large amount of light with a wavelength of 600 to 730 nm relatively, it can be the white light $L_W$ specified by JIS D5500. This region is that including a complementary color for reddish orange to red indicated by light with a wavelength of 600 to 730 nm. However, since the color filter 2 has a restrictive transmission for light with a wavelength of less than 600 nm, the light $L_G$ that before transmitted through the color filter 2 is in a chromaticity range narrower than the hatched area. Specifically, a region closer to a negative direction of an x-coordinate, that is, a region close to the monochromatic locus has a large shift amount of chromaticity to the white light $L_W$, it is difficult to change the region to the specified white light $L_W$. In particular, 80% or more of light with a wavelength of 500 to 550 nm is absorbed by the color filter 2.

Therefore, the first light $L_G$ is desirably set to bluish green or a color close to the bluish green in a chromaticity range in which excitation purity (chroma) at a dominant wavelength of 485 to 580 nm is not high. In detail, chromaticity of the first light $L_G$ is set according to a transmission spectrum of the color filter 2 and a target coordinate of chromaticity of the white light $L_W$. Such first light $L_G$ has, as a main emission peak wavelength within the range of 380 to 780 nm, at least two emission peak wavelengths, that is, an emission peak wavelength having maximum intensity, and an emission peak wavelength having intensity with no excessively large difference from the maximum intensity. Alternatively, the first light $L_G$ has, as a main emission peak wavelength peak within the range of 380 to 780 nm, one emission peak wavelength having a wide half width. In order to obtain the light $L_G$ having the set chromaticity, as explained below, a phosphor layer having an appropriate emission wavelength is selected as the first phosphor layer 51 on the basis of a wavelength and the like of the blue light $L_{B1}$ emitted by the first light emitting element 41. Further, a wavelength conversion rate of the blue light $L_{B1}$ by the first phosphor layer 51 is set.

When the first light $L_G$ has the two emission peak wavelengths, the emission peak wavelength on the shorter wavelength is desirably 400 nm or more and 480 nm or less, the emission peak wavelength on the longer wavelength is desirably 510 nm or more and 580 nm or less. These two emission peak wavelengths are respective emission peak wavelengths of the first light emitting element 41 and the first phosphor layer 51. As the emission peak wavelength on the longer wavelength is longer, intensity of the emission peak wavelength on the shorter wavelength is desirably set relatively high. In particular, when the emission peak wavelength on the longer wavelength exceeds 550 nm, the emission peak wavelength on the shorter wavelength has desirably high intensity. If the emission peak wavelength on the shorter wavelength has high intensity in such first light $L_G$, emission efficiency of the white light $L_W$ increases.

On the other hand, when the first light $L_G$ has one emission peak wavelength, the emission peak wavelength is desirably 485 nm or more and 550 nm or less and more desirably 530 nm or less. A half width of the emission peak wavelength is desirably 50 nm or more and more desirably 70 nm or more. This emission peak wavelength is that of the first phosphor layer 51. Since the light $L_G$ having one emission peak wavelength is formed, color unevenness of the white light $L_W$ less easily occurs. Consequently, the first light $L_G$ is considered to be desirable to have the maximum intensity emission peak wavelength of 400 nm or more and 550 nm or less irrespective of the number of emission peak wavelengths.

Operation for emitting the orange light $L_A$ is explained. When passing through the second phosphor layer 52, at least a part of the blue light $L_{B2}$ emitted by the second light emitting element 42 is wavelength-converted by the second phosphor in the second phosphor layer 52. The wavelength-converted light or light obtained by mixing the light and the light $L_{B2}$ passed through the transparent resin in the second phosphor layer 52 without being wavelength-converted is emitted from the second light emitting device 12 as the second light $L_Y$. When passing through the color filter 2, the second light $L_Y$ changes to the orange light $L_A$ and is emitted from the lighting apparatus 10. Since the color filter 2 absorbs a part of light with a wavelength of 410 to 480 nm and at least a part of light with a wavelength of 500 to 550 nm. Therefore, when the second light $L_Y$ contains light with these wavelength ranges, when the second light $L_Y$ passes through the color filter 2, it is shifted to the orange light $L_A$.

When light in a chromaticity range that shown an upward to right hatched area in FIG. 3 is transmitted through a red color filter transmitting light with a wavelength of 600 to 730 nm, it can be the orange light $L_A$ specified by JIS D5500. However, a shift amount of chromaticity to the orange light $L_A$ is larger further in a negative direction of an x-coordinate and a positive direction of a y-coordinate, that is, in a shorter wavelength. It is difficult to obtain the specified orange light $L_A$. A part of light with a wavelength of 480 nm or less is transmitted through the color filter 2. Therefore, the second light $L_Y$ that before transmitted through the color filter 2 is desirably set to yellow or a color close to yellow in a chromaticity range equivalenting to a dominant wavelength of 530 to 590 nm in the hatched area.

Such second light $L_Y$ has an emission peak wavelength having maximum intensity at a wavelength of 510 to 590 nm, as a main emission peak wavelength within the range of 380 to 780 nm. The second light $L_Y$ is obtained by wavelength-converting a larger amount of the blue light $L_{B2}$ by the second phosphor layer 52. The entire blue light $L_{B2}$ is most desirably wavelength-converted. Further, in the second light $L_Y$, emission efficiency of the orange light $L_A$ is higher as the emission peak wavelength is longer. On the other hand, if the emission peak wavelength is longer exceeding 550 nm, a change in an emission spectrum from the second light $L_Y$ to the orange light $L_A$ is small, and a half width of the emission spectrum is not narrowed. As the second phosphor layer 52, it is desirable to apply a phosphor layer not having an excessively wide half width of an emission wavelength. Consequently, the second light $L_Y$ is the same color as the orange light $L_A$ or a color extremely close to the orange light $L_A$. Chromaticity of the second light $L_Y$ is set according to a transmission spectrum of the color filter 2 and a target coordinate of chromaticity of the orange light $L_A$. In order to obtain such light $L_Y$, a phosphor layer having an appropriate emission wavelength is selected as the second phosphor layer 52 as explained above.

Operation for emitting the red light $L_R$ is explained. When passing through third phosphor layer 53, at least a part of the blue light $L_{B3}$ emitted by the third light emitting element 43 is wavelength-converted by the third phosphor in the third phosphor layer 53. The wavelength-converted light or light obtained by mixing the light and the light $L_{B3}$ passed through the transparent resin in the third phosphor layer 53 without being wavelength-converted is emitted from the third light emitting device 13 as the third light $L_{Ri}$. When passing through the color filter 2, the third light $L_R$ changes to the red light $L_R$ and is emitted from the lighting apparatus 10. Since the color filter 2 transmits most of light with a wavelength of 600 to 730 nm, it is difficult to shift to the red light $L_R$ in a chromaticity range equivalent to a dominant wavelength of 610 to 780 nm from a short wavelength side. Therefore, the light $L_{Ri}$ before being transmitted through the color filter 2 to be the red light $L_R$ in a predetermined chromaticity range is desirably the same color as the red light $L_R$ or red extremely close to the red light $L_R$. Alternatively, the third light $L_{Ri}$ may be reddish purple containing the blue light $L_{B3}$ to such a degree that absorbed by the color filter 2 and almost completely disappears.

Such third light $L_{Ri}$ has an emission peak wavelength having maximum intensity at a wavelength of 600 to 700 nm, as a main emission peak wavelength within the range of 380 to 780 nm. The third light $L_{Ri}$ is obtained by wavelength-converting a larger amount of the blue light $L_{B3}$ by the third phosphor layer 53. The entire blue light $L_{B3}$ is most desirably wavelength-converted. Chromaticity of the third light $L_{Ri}$ is set according to a transmission spectrum of the color filter 2 and a target coordinate of chromaticity of the red light $L_R$. In order to obtain such light $L_{Ri}$, a phosphor layer having an appropriate emission wavelength is selected as the third phosphor layer 53 as explained above.

As explained above, in the lighting apparatus 10, the non-white first light $L_G$ is shifted to the white light $L_W$ and is extracted, by the red color filter 2. On the other hand, the second light $L_Y$ and the third light $L_{Ri}$ are respectively changed to beams of light of the same color or the shifted orange light $L_A$ and the shifted red light $L_R$ by the color filter 2. The first light $L_G$ is obtained from a combination of the first light emitting element 41 and the first phosphor layer 51 respectively having specific emission peak wavelengths, to be beams of light having a certain degree or more of intensity in respective wavelength ranges of blue light and yellow light. On the other hand, the second light $L_Y$ is obtained from a combination of the second light emitting element 42 and the second phosphor layer 52 having a specific emission peak wavelength. Therefore, the second light $L_Y$ is easily controlled more stably than direct light emitted from a light emitting element. Similarly, the third light $L_{Ri}$ is obtained from a combination of the third light emitting element 43 and the third phosphor layer 53 having a specific emission peak wavelength. Therefore, the third light $L_{Ri}$ is easily controlled more stably than direct light emitted from a light emitting element.

About the white light $L_W$, the orange light $L_A$, the red light $L_R$, and the reflected light, the lighting apparatus 10 is not limited to the light colors specified in JIS D5500. The lighting apparatus 10 can be designed to desired light colors according to uses. Chromaticity of the light $L_G$, $L_Y$, and $L_{Ri}$ and a transmission spectrum of the color filter 2 are set according to the light colors.

In the lighting apparatus 10, the first light emitting device 11, the second light emitting device 12, and the third light emitting device 13 are respectively arrayed in regions of desired shapes on the bottom surface in the housing 3. Therefore, the white light $L_W$, the orange light $L_A$, and the red light $L_R$ are extracted in the respective shapes of the regions. Respective array pitches of the first light emitting device 11, the second light emitting device 12, and the third light emitting device 13 do not have to be the same. In particular, whereas approximately 80% or more of the third light $L_{Ri}$, is transmitted through the color filter 2, most of the first light $L_G$ is absorbed. Therefore, attenuation of a light amount from the first light $L_G$ to the white light $L_W$ is large. Therefore, it is desirable to design the respective numbers and array pitches of the first light emitting device 11, the second light emitting device 12, and the third light emitting device 13 and luminance and the like of the light emitting element 4 to be mounted such that the white light $L_W$, the orange light $L_A$, and the red light $L_R$ are respectively extracted at necessary light amounts.

In order to prevent color mixture of the white light $L_W$, the orange light $L_A$, and the red light $L_R$, the lighting apparatus 10 is desirable structured such that two or more optical paths of the first light $L_G$, the second light $L_Y$, and the third light $L_{Ri}$ do not overlap before passing through the color filter 2. Specifically, for example, the first light emitting device 11 and the third light emitting device 13 are arrayed to be spaced apart from each other and the second light emitting device 12 and the third light emitting device 13 are arrayed to be spaced apart from each other. Alternatively, partitions may be provided, for example, between a region where the first light emitting device 11 is arrayed and a region where the third light emitting device 13 is arrayed and between a region where the second light emitting device 12 is arrayed and a region where the third light emitting device 13 is arrayed. Alternatively, for example, when the white light $L_W$ and the red light $L_R$ are simultaneously emitted, at least one of the first light emitting devices 11 and the third light emitting devices 13 may be designed such that a part disposed near a boundary between the regions where the first light emitting devices 11 and the third light emitting devices 13 are respectively arrayed is not lit. On the other hand, by disposing different two kinds or more of the first light emitting devices 11, the second light emitting devices 12, and the third light emitting devices 13 to be close to one another or mixed, it is possible to configure the lighting apparatus 10 to switch and emit the white light $L_W$, the orange light $L_A$, and the red light $L_R$ from one region.

(Modifications)

The housing 3 may have a shape divided for each of the regions where the first light emitting devices 11, the second light emitting devices 12, and the third light emitting devices 13 are respectively arrayed. By providing walls having reflection surfaces among the regions using the housing 3, it is easy to control respective emission directions of the white light $L_W$, the orange light $L_A$, and the red light $L_R$. The lighting apparatus 10 emits light with increased emission efficiency. The bottom surface in the housing 3 does not have to be a plane. For example, the housing 3 may be configured such that the bottom surface is formed as a convex surface swelled in the center of each of the regions and the beams of light $L_G$, $L_Y$, and $L_{Ri}$ are spread and emitted from respective groups of the first light emitting devices 11, the second light emitting devices 12, and the third light emitting devices 13 arrayed on such a bottom surface.

The first phosphor layer 51, the second phosphor layer 52, and the third phosphor layer 53 (if not specified, referred to as phosphor layer 5) may be formed by, for example, molding by a die. For example, the phosphor layer 5 can be molded into a dome shape that covers the light emitting element 4 mounted on the package 6 formed into a plate (a wiring board 6A). The phosphor layer 5 may not be a sealing member of the light emitting element 4 and may be a plate member obtained by applying transparent resin dispersed with a phosphor to a transparent substrate such as glass by potting, printing, spraying, or the like. Alternatively, the phosphor layer 5 may be a phosphor layer obtained by dispersing particles in an organic solvent and aggregated on the light emitting element 4 or may be a plate member sintered together with an inorganic material such as glass. With such a phosphor layer 5 not dispersed in resin, wavelength conversion efficiency of blue light $L_B$ increases. Color unevenness of the beams of light $L_G$, $L_Y$, and $L_{Ri}$ is easily prevented. The plate-like phosphor layer 5 can be bonded to the upper surface of the light emitting element 4 by transparent resin or the like. In this case, it is desirable to prevent the blue light $L_B$ from leaking by, for example, covering the side surface of the light emitting element 4 with resin added with a light reflective substance. Alternatively, as in a modification explained below, the plate-like phosphor layer 5 can be fixed on the upper side of the mounted light emitting element 4.

Figure 4:
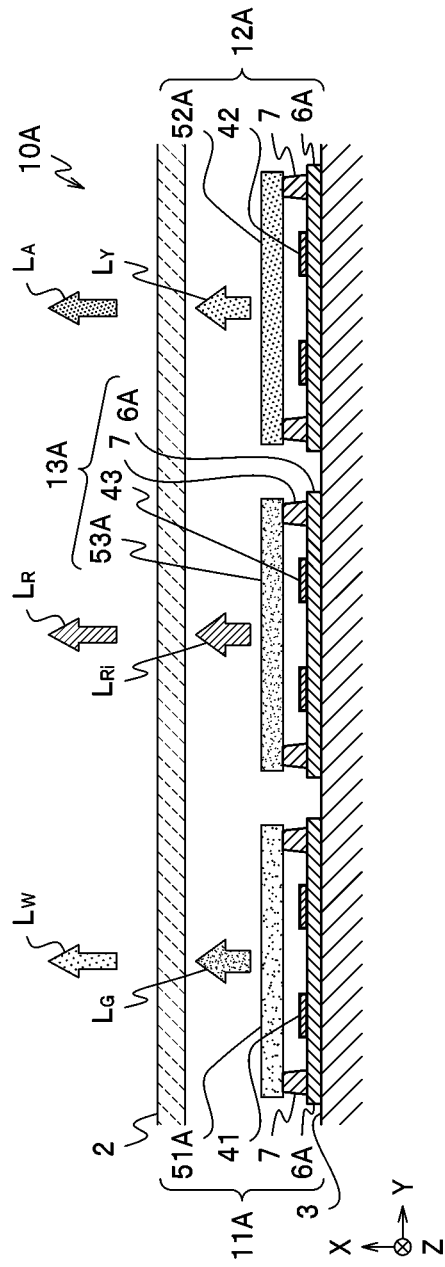
FIG. 4 is an enlarged sectional view schematically showing a partial configuration of a lighting apparatus according to a modification of the embodiment.

In the lighting apparatus 10, one light emitting element 4 is mounted on each of the first light emitting device 11, the second light emitting device 12, and the third light emitting device 13. However, not only this but, the lighting apparatus 10 may include, for each of the regions, a planar light emitting device on which a plurality of light emitting elements 4 are arrayed and mounted. The configuration of a lighting apparatus according to a modification of the embodiment of the present disclosure is explained below with reference to FIG. 4. FIG. 4 is an enlarged sectional view schematically showing a partial configuration of the lighting apparatus according to the modification of the embodiment.

The lighting apparatus 10A includes one each of a first light emitting device 11A including a first phosphor layer 51A and a plurality of first light emitting elements 41, a second light emitting device 12A including a second phosphor layer 52A and a plurality of second light emitting elements 42, and a third light emitting device 13A including a third phosphor layer 53A and a plurality of third light emitting elements 43 that are housed in the housing 3. The lighting apparatus 10A includes the color filter 2 fixed to the upper surface of the housing 3 to close the opening of the housing 3. Further, each of the first light emitting device 11A, the second light emitting device 12A, and the third light emitting device 13A includes a wiring board 6A and a frame body 7. According to necessity, transparent resin for sealing the light emitting element 4 may be filled on the inner side of the frame body 7. In the first light emitting device 11A, the plurality of first light emitting elements 41 are arrayed and mounted on the wiring board 6A. The frame body 7 bonded to the peripheral edge on the wiring board 6A supports one first phosphor layer 51A. The second light emitting device 12A and the third light emitting device 13A have the same structure as the first light emitting device 11A. The first phosphor layer 51A, the second phosphor layer 52A, and the third phosphor layer 53A are respectively plate members obtained by sintering phosphors having predetermined emission peak wavelengths together with an inorganic material as explained above. Like the package 6, the wiring board 6A is a base that supports the light emitting element 4. The wiring board 6A includes lead electrodes. The frame body 7 is provided to prevent the blue light $L_B$ from directly reaching the color filter 2 from the light emitting element 4. The frame body 7 and the wiring board 6A are desirably configured to reflect light.

Further, for example, the lighting apparatus 10 can also be configured to include, a predetermined number of the first light emitting devices 11 and the second light emitting devices 12 and one third light emitting device 13A. The lighting apparatus 10 can also be a lighting apparatus of the white light $L_W$ that includes only the first light emitting device 11 to be a reflector that reflects red light from at least a part of the emission surface when not lit. Alternatively, according to a use, the lighting apparatus 10 can also include two kinds of the first light emitting device 11 and the second light emitting device 12 or the third light emitting device 13 and be configured to emit beams of light of two colors of white light $L_W$ and the orange light $L_A$ or the white light $L_W$ and the red light $L_R$. That is, the lighting apparatus 10 includes two or more kinds of phosphor layers of the first phosphor layer 51 and at least one of the second phosphor layer 52 and the third phosphor layer 53, the light emitting elements 4 disposed in such positions that light is incident on each of the phosphor layers, and the color filter 2 disposed in such a position that light emitted from each of the phosphor layers is incident on the color filter 2. Similarly, the lighting apparatus 10A can also be configured to include only the first light emitting device 11A or two kinds of the first light emitting device 11A and the second light emitting device 12A or the third light emitting device 13A.

As explained above, by combining the phosphor having the specific emission wavelength with the light emitting element that emits the blue light, the lighting apparatus according to the embodiment of the present disclosure can emit the white light even if the red cover is provided on the emission surface. Further, since the lighting apparatus includes the set of the phosphor of yellowish and reddish color and the light emitting element, it is possible to emit white light, orange light, and red light of light colors specified as signal lamps and display lamps of an automobile while forming at least a part of the emission surface as the red reflector. Therefore, it is possible to configure a lighting apparatus that emits beams of light of a desired color scheme pattern according to an array and the like of the light emitting elements without color-coding the cover.

EXAMPLES

Figure 5:
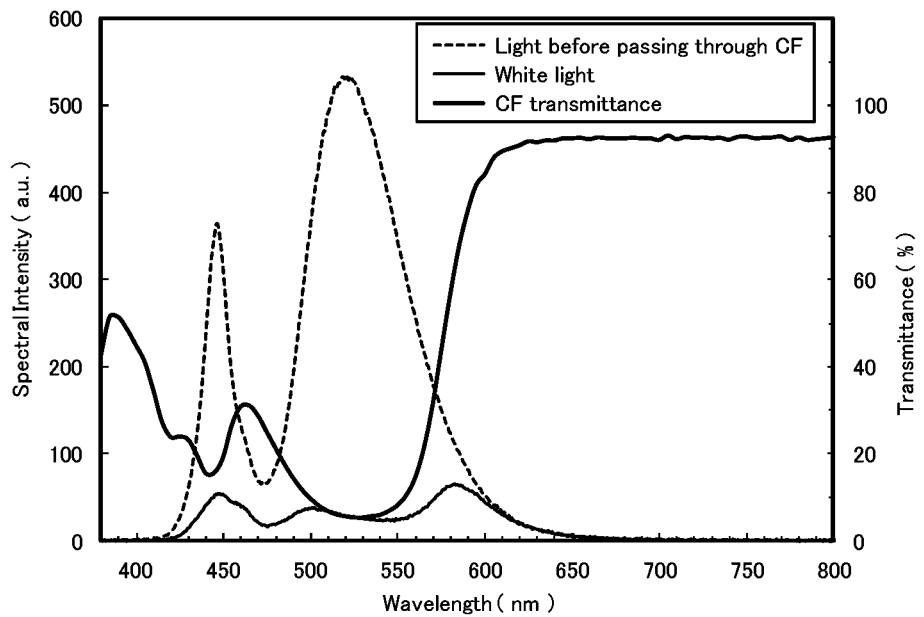
FIG. 5 is a graph showing emission spectra of white light and light before the white light passes through a color filter, and a transmission spectrum of the color filter in a lighting apparatus according to an example.
Figure 6:
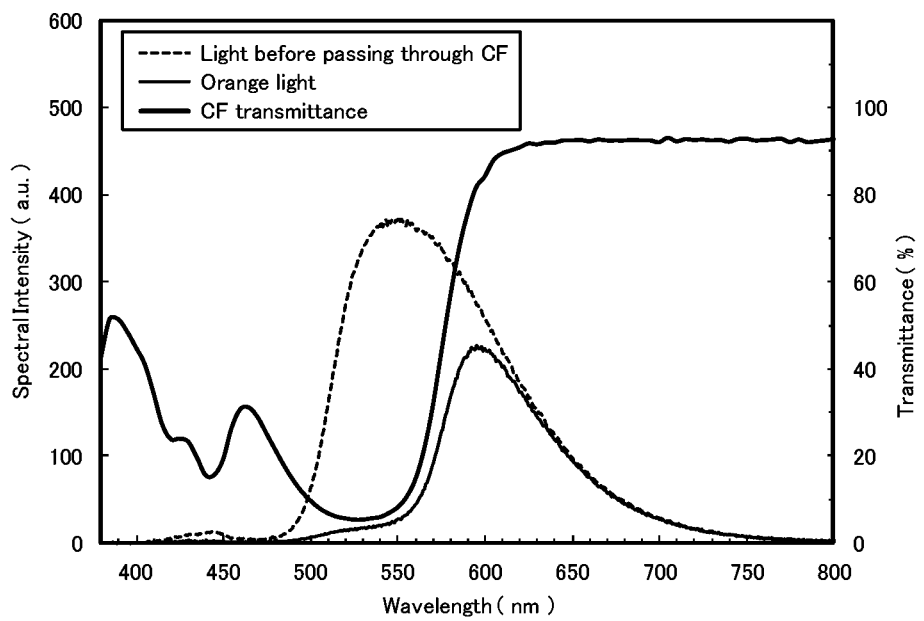
FIG. 6 is a graph showing emission spectra of orange light and light before the orange light passes through a color filter, and a transmission spectrum of the color filter in a lighting apparatus according to an example.
Figure 7:
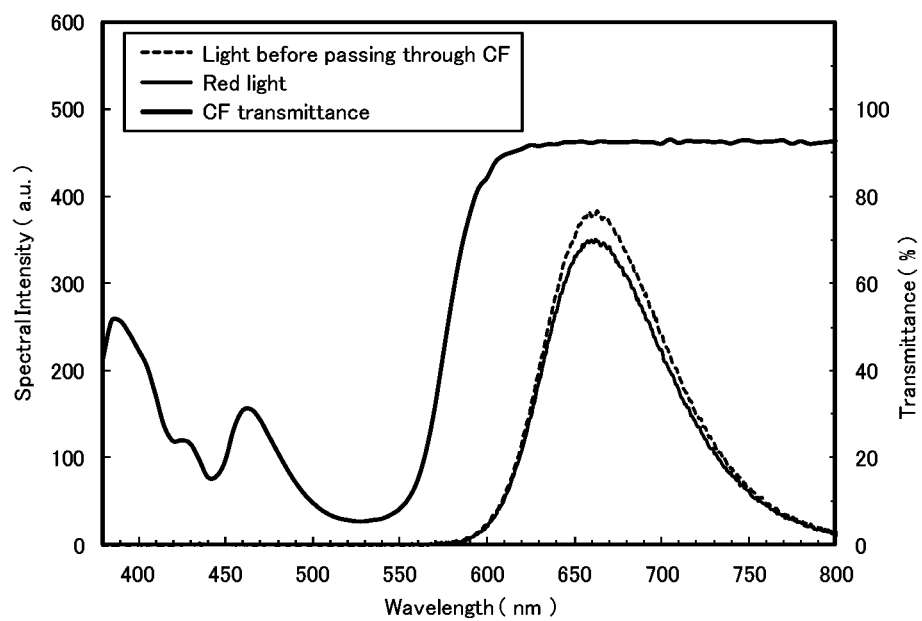
FIG. 7 is a graph showing emission spectra of red light and light before the red light passes through a color filter, and a transmission spectrum of the color filter in a lighting apparatus according to an example.
Figure 8:
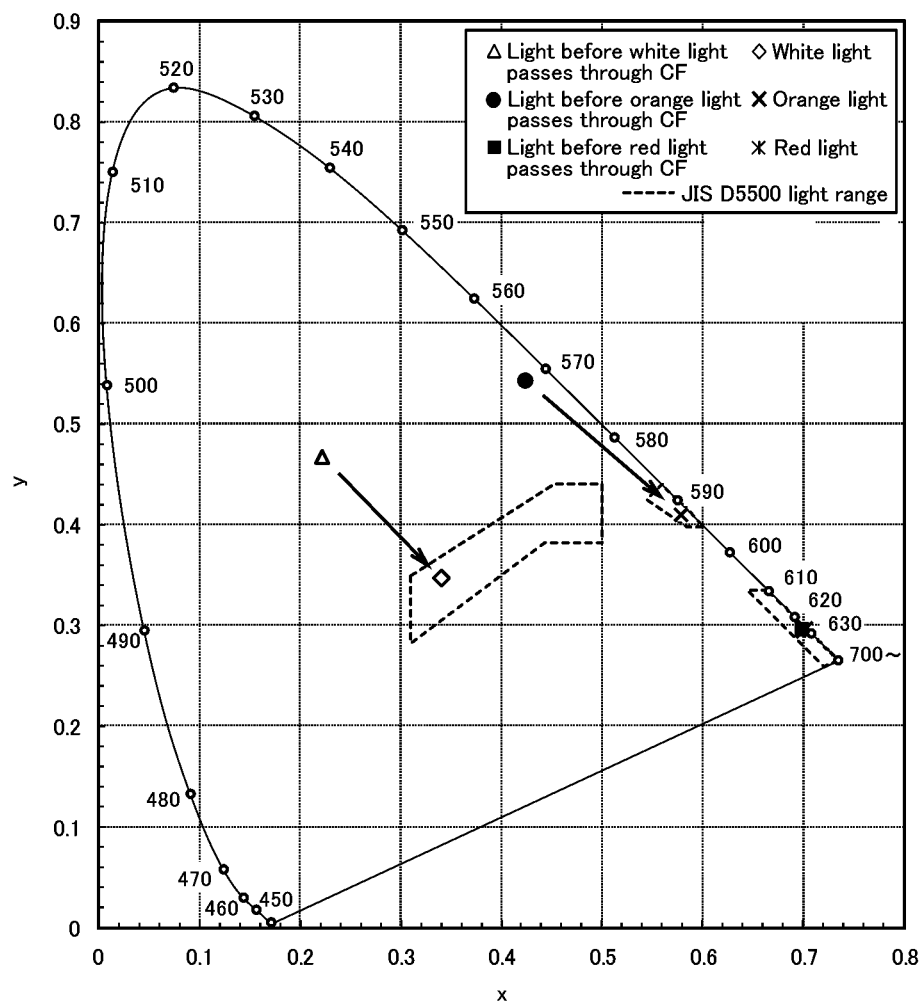
FIG. 8 is a chromaticity diagram showing chromaticity coordinates of light before and after passing through a color filter in a lighting apparatus according to the example.

As examples of the present disclosure, samples simulating the lighting apparatus according to the embodiment were experimentally manufactured and effects of the samples were confirmed. In the examples, three kinds of light emitting devices emitting beams of such light that before passing through a color filter were manufactured. Emission spectra of light extracted before and after passing through the color filter were measured. FIGS. 5, 6, and 7 are graphs showing transmission spectra of a color filter and emission spectra of light before and after passing through the color filter in a lighting apparatus according to an example. FIG. 5 shows spectra of white light, FIG. 6 shows spectra of orange light, and FIG. 7 shows spectra of red light. FIG. 8 is a chromaticity diagram showing chromaticity coordinates of light before and after passing through the color filter in the lighting apparatus according to the example.

(Manufacturing of Samples)

A chip of an LED having an emission peak wavelength in an emission spectrum of which was 445 nm, was used as a common light emitting element. The light emitting element was sealed by silicone resin added with 27 phr of chlorosilicate-based phosphor ($Ca_8MgSi_4O_{16}Cl_2$:Eu) having an emission peak wavelength in an emission spectrum of 520 nm, to manufacture a sample 1 of the light emitting device. The light emitting element was sealed by silicone resin added with 150 phr of a YAG phosphor having an emission peak wavelength in an emission spectrum of 550 nm, to manufacture a sample 2 of the light emitting device. The light emitting element was sealed by silicone resin added with 120 phr of a CASN phosphor having an emission peak wavelength in an emission spectrum of 660 nm, to manufacture a sample 3 of the light emitting device. A red filter for the transmission spectra shown in FIGS. 5 to 7 was used as a color filter (CF).

(Evaluation)

About the manufactured samples 1, 2, and 3, the light emitting elements were respectively caused to emit light and emission spectra, chromaticity, and light flux ($\phi v$) were measured. Subsequently, emission spectra, chromaticity, and light flux were measured in the same manner about beams of light transmitted through the color filter. The chromaticity and the light flux are shown in Table 1. Intensities of the emission spectra shown in FIGS. 5, 6 and 7 are relative values in the respective samples.

TABLE 1

| | Before passing through CF | | | After passing through CF | | | Change amount before and after passing through CF | | |
|---|---|---|---|---|---|---|---|---|---|
| | Chromaticity | | | Chromaticity | | | Chromaticity | | |
| | x | y | $\phi v$ [lm] | x | y | $\phi v$ [lm] | $\Delta x$ | $\Delta y$ | $\Delta \phi v$ |
| White tight | 0.222 | 0.467 | 71.8 | 0.340 | 0.347 | 9.7 | 0.118 | −0.120 | 13.6% |
| Orange light | 0.424 | 0.543 | 77.3 | 0.578 | 0.410 | 23.9 | 0.155 | −0.133 | 30.9% |
| Red light | 0.699 | 0.296 | 7.7 | 0.701 | 0.295 | 7.0 | 0.003 | −0.001 | 91.2% |

Light emitted from the sample 1 had a maximum intensity emission peak wavelength of 520 nm by the phosphor, had a high emission peak wavelength of 445 nm by light emitted by the light emitting element as well, and assumed a bluish green color. When the light was transmitted through the color filter, approximately 15 to 25% of light with a wavelength of 420 to 480 nm was absorbed by the color filter and the intensity of the emission peak wavelength of 445 nm was decreased. At the maximum intensity emission peak wavelength, approximately 90% or more of light with a wavelength of 500 to 550 nm was absorbed. The light was greatly weakened, and the intensity decreased to the same degree as the emission peak wavelength of 445 nm. The emission peak wavelength was shifted to approximately 580 nm. As a result, white light with color mixed of purplish blue and yellowish orange was obtained. The x-coordinate of the chromaticity of the light was shifted in the positive direction and the y-coordinate of the chromaticity of the light was shifted in the negative direction, with respect to chromaticity of the light before transmitted through the color filter, to fall within the chromaticity range specified in JIS D5500.

Light emitted from the sample 2 had a maximum intensity emission peak wavelength of 550 nm by the phosphor, on the other hand, had extremely low intensity of an emission peak wavelength of 445 nm by light emitted by the light emitting element, and assumed a greenish yellow color having a dominant wavelength of approximately 570 nm. When the light was transmitted through the color filter, light with a wavelength of 420 to 480 nm was absorbed by the color filter and the emission peak wavelength of 445 nm was not observed. At the maximum intensity emission peak wavelength, approximately 90% or more of light with a wavelength of 500 to 550 nm was absorbed, on the other hand, approximately 80% or more of light with a wavelength of 595 nm or more was transmitted. Therefore, a half width was narrowed. The emission peak wavelength was shifted to approximately 595 nm and the intensity decreased. As a result, orange light indicated by the emission peak wavelength was obtained and excitation purity increased. The x-coordinate of the chromaticity of the light was shifted in the positive direction and the y-coordinate of the chromaticity of the light was shifted in the negative direction, with respect to chromaticity of the light before transmitted through the color filter, to fall within the chromaticity range specified in JIS D5500.

Light emitted from the sample 3 had an emission peak wavelength of 660 nm by the phosphor, on the other hand, had no an emission peak wavelength of 445 nm observed. Red light having a dominant wavelength of approximately 625 nm was obtained. The chromaticity of the light fell within the chromaticity range specified in JIS D5500. When the light is transmitted through the color filter, approximately 90% or more of light with a wavelength of 615 nm or more was transmitted. Therefore, the emission peak wavelength was not shifted and a decrease in the intensity was little. As a result, the chromaticity of the light hardly shifted and was within the chromaticity range specified in JIS D5500 even when the light is transmitted through the color filter.

When changes before and after light passing through the color filter of each of the sample 1 and the sample 2 are compared, differences in a shift direction and a shift amount of the chromaticity were small. However, in the sample 1, a light amount was greatly attenuated.

By setting the emission wavelength of the phosphor and the transmission spectrum of the color filter in predetermined ranges, the w % bite light, the orange light, and the red light were successfully transmitted and emitted from the same color filter.

The lighting apparatus according to the present disclosure can be used in a rear combination lamp of an automobile.

What is claimed is:

1. A lighting apparatus comprising:
    a first light emitting element having an emission peak wavelength of 400 nm or more and 510 nm or less;
    a first phosphor disposed in such a position that light emitted by the first light emitting element is incident on the first phosphor, wherein the first phosphor is excited by the light, the first phosphor has an emission peak wavelength of 485 to 700 nm; and
    a color filter that
        is red,
        is disposed in a position separate from the first phosphor such that a first light that includes light emitted from the first light emitting element and light emitted from the first phosphor is incident on the color filter,
        transmits a part of the first light, absorbs a part of light with a wavelength of 410 nm or more and 480 nm or less contained in the first light and
        absorbs a part of light with a wavelength of 500 nm or more and 550 nm or less contained in the first light,
    wherein the lighting apparatus emits light transmitted through the color filter, and a component of the first light, after being transmitted through the color filter, is within a chromaticity range of $0.500 \geq x \geq 0.310$, $y \leq 0.150 + 0.640x$, $y \geq 0.050 + 0.750x$, and $0.440 \geq y \geq 0.382$ in chromaticity coordinates of JIS Z8701.

2. The lighting apparatus according to claim 1, further comprising:
    a second light emitting element having an emission peak wavelength of 400 nm or more and 510 nm or less; and
    a second phosphor disposed in such a position that light emitted by the second light emitting element is incident on the second phosphor, the second phosphor is excited by the light, the second phosphor has an emission peak wavelength of 510 nm or more and 590 nm or less, wherein
    the color filter is disposed in such a position that a second light that includes light emitted from the second light emitting element and light emitted from the second phosphor is incident on the color filter, and the color filter transmits at least a part of the second light.

3. The lighting apparatus according to claim 2, wherein the second light after being transmitted through the color filter is within a chromaticity range of $0.429 \geq y \geq 0.398$ and $z \leq 0.007$ in chromaticity coordinates of JIS Z8701.

4. The lighting apparatus according to claim 2, wherein the second phosphor is a YAG phosphor.

5. The lighting apparatus according to claim 1, further comprising:
    a third light emitting element having an emission peak wavelength of 400 nm or more and 510 nm or less; and
    a third phosphor disposed in such a position that light emitted by the third light emitting element is incident on the third phosphor, the third phosphor is excited by the light, the third phosphor has an emission peak wavelength of 600 nm or more and 700 nm or less, wherein
    the color filter is disposed in such a position that a third light that includes light emitted from the third light emitting element and light emitted from the third phosphor is incident on the color filter, and the color filter transmits at least a part of the third light.

6. The lighting apparatus according to claim 5, wherein the third light after being transmitted through the color filter is within a chromaticity range of $y \leq 0.335$ and $z \leq 0.008$ in chromaticity coordinates of JIS Z8701.

7. The lighting apparatus according to claim 5, wherein the third phosphor is a CASN phosphor.

8. The lighting apparatus according to claim 1, wherein at least a part of the color filter is within a chromaticity range of $y \geq 0.335$ and $z \leq 0.008$ in chromaticity coordinates of JIS Z8701.

9. The lighting apparatus according to claim 1, wherein, the color filter has transmittance for light with a wavelength of 500 nm or more and 550 nm or less that is 20% or less.

10. The lighting apparatus according to claim 1, wherein the first phosphor is a chloro-silicate-based phosphor.

11. The lighting apparatus according to claim 1, wherein the first phosphor has an emission peak wavelength of 500 nm or more and 580 nm or less.

12. The lighting apparatus according to claim 1, wherein the color filter comprises a resin containing at least one pigment of an azo compound, a cyanine compound, a perylene compound, or a dioxazine compound.

13. The lighting apparatus according to claim 1, wherein the color filter is disposed so as to cover over the first light emitting element in a top view.

14. The lighting apparatus according to claim 1, wherein the first phosphor is disposed adjacent to the first light emitting element and the color filter is disposed so as to cover over the first light emitting element and the first phosphor in a top view.

15. The lighting apparatus according to claim 1, wherein the lighting apparatus is used in an automobile.

16. The lighting apparatus according to claim 1, wherein the lighting apparatus is used in a rear combination lamp.

* * * * *